United States Patent [19]

Cho et al.

[11] Patent Number: 5,327,626

[45] Date of Patent: Jul. 12, 1994

[54] METHOD FOR PROCESSING ROBUST ACOUSTIC REFLECTORS

[75] Inventors: Frederick Y. Cho, Scottsdale; Thomas S. Hickernell, Tempe; David Penunuri, Fountain Hills, all of Ariz.

[73] Assignee: Motorola, Inc., Schaumburg, Ill.

[21] Appl. No.: 976,749

[22] Filed: Nov. 16, 1992

Related U.S. Application Data

[62] Division of Ser. No. 733,933, Jul. 22, 1991, Pat. No. 5,270,606.

[51] Int. Cl.$^5$ .............................................. H01L 41/22
[52] U.S. Cl. .................................... 29/25.35; 310/313 B
[58] Field of Search .................... 29/25.35; 333/195; 310/313 B, 313 D

[56] References Cited

U.S. PATENT DOCUMENTS

| | | | |
|---|---|---|---|
| 3,931,598 | 1/1976 | Bongianni | 333/30 R |
| 4,249,146 | 2/1981 | Yen et al. | 333/195 |
| 4,267,534 | 5/1981 | Tanski | 333/153 |
| 4,281,301 | 7/1981 | Stevens et al. | 333/195 |
| 4,894,576 | 1/1990 | Okamoto et al. | 310/313 D |
| 5,010,269 | 4/1991 | Hikita et al. | 310/313 B |
| 5,051,644 | 9/1991 | Wright | 310/313 B |

FOREIGN PATENT DOCUMENTS 1492766 11/1977 United Kingdom .......... H03H 9/00

OTHER PUBLICATIONS

An article entitled "An Integrated ZnO/Si-MOSFET Programmable Matched Filter" by F. Hickernell, M. Adamo, A. London and H. Bush, 1975 Ultrasonics Symposium Proceedings, IEEE Cat. No. 75 CHO 994-4SU, pp. 223-226.

An article entitled "Modeling and Experimental Measurements of the Reflector Properties of SAW Metallic Gratings" by P. V. Wright, Proc. 1984 IEEE Ultrason. Symp., pp. 54-63.

An article entitled "Single-Phase, Unidirectional Transducer Design for Charge Transport Devices" by D. Penunuri, F. M. Fliegel, F. S. Hickenell and F. Y. Cho, 1990 Ultrasonics Symposium, 1990 IEEE, pp. 237-242.

Primary Examiner—Carl E. Hall
Attorney, Agent, or Firm—Frederick M. Fliegel

[57] ABSTRACT

A reflector arrangement for an acoustic wave device comprises an acoustic wave propagating substrate, reflection elements having at least two different widths separated by at least one gap breadth disposed on the acoustic wave propagating substrate. The at least two different widths enhance reflected waves produced by the propagating acoustic wave in such a fashion as to achieve a total acoustic reflectivity which is independent of variations in width of the reflection elements.

20 Claims, 6 Drawing Sheets

METHOD FOR PROCESSING ROBUST ACOUSTIC REFLECTORS

This is a division of application Ser. No. 07/733,933, filed Jul. 22, 1991, now U.S. Pat. No. 5,270,606.

FIELD OF THE INVENTION

The present invention pertains to microelectronic devices employing acoustic waves and more particularly to devices employing acoustic wave reflectors.

BACKGROUND OF THE INVENTION

A broad variety of new demands are being placed on the electromagnetic spectrum, leading to difficulty in allocating radio wave frequency bands as new kinds of equipment based on radio wave communication are developed. Several recent examples of such developments include extremely light-weight, hand-portable cellular telephones, wireless local area networks for linking computer systems within office buildings in a readily reconfigurable fashion, wireless infant monitors, wristwatch-sized paging apparatus, and a host of other devices for promoting rapid, efficient, and flexible voice and data communication.

This has resulted in pressure to employ progressively higher radio frequencies (e.g., >500 MegaHertz) and need to utilize spectral space more efficiently. These trends create requirements for frequency selection components capable of high frequency operation and increasingly narrow passbands. Additionally needed are low insertion loss coupled with improved out-of-band signal rejection, in a small form factor and with low power consumption.

To meet these demands, there is at the present time much effort and expense going into research and development relating to acoustic wave devices such as filters, delay lines, resonator devices and lattice filters for a variety of practical applications. Acoustic wave devices are becoming particularly important in the construction of electronic signal processing equipment, such as radios, paging devices, and other high frequency electronic apparatus, because they can be readily constructed on planar surfaces using integrated circuit fabrication techniques, are robust and compact, require no initial or periodic adjustment, and consume no static power.

These devices operate by conversion of electrical signal energy into acoustic energy, which then propagates through or in the near surface region of a suitable acoustic medium. This energy conversion process often relies on the piezoelectric effect as manifested by materials which form certain non-centrosymmetric crystal types, such as ZnO, CdTe, $LiNbO_3$, $LiTaO_3$, $SiO_2$, $BiGeO_{20}$, GaAs, and the like. Acoustic energy is usually converted back to electrical energy by another or the originating transducer, producing the desired electronic performance. A basic equation describing signal frequency $f_{sig}$, acoustic wavelength $\lambda$, and properties of the acoustic medium is:

$$\lambda f_{sig} = v_s \qquad (1)$$

where $v_s$ represents acoustic velocity in the acoustic medium. For a given acoustic velocity $v_s$, increased $f_{sig}$ requires reduced $\lambda$.

Wave propagating acoustic transducers rely on electrodes which are usually a fraction of a wavelength in width. Photolithographic constraints together with Eq. 1 determine an upper frequency limit by setting a lower electrode width limit. The current minimum electrode width is about one micrometer for practical mass-production equipment and techniques. This minimum electrode width sets the upper frequency limit between about one and two GigaHertz. At present, this is a frequency range of intense interest for development of new electronic products.

The material used for the transducer electrodes typically has either mass density or stiffness mismatch to the acoustic impedance of the acoustic medium. This often results in acoustic reflections from electrode structures. Examples of dense materials providing mass mismatch include gold, silver, osmium, and the like. Materials which are extremely stiff, and so produce stiffness mismatch, include chromium and tungsten.

Further, the mere presence of conductive materials engenders acoustic impedance mismatch through the piezoelectric effect, resulting in acoustic reflections. Materials such as aluminum and alloys thereof, which are flexible, have low density, are excellent electrical conductors, and which are easily prepared and patterned in thin film form, are preferred for such acoustic device electrodes.

Control of fabrication variables, such as the ratio of electrode width to spacing, metal thickness, and the like, becomes progressively more difficult as photolithographic limits are approached, i.e., as the desired electrode widths become smaller. This results in reduced fabrication yields for devices requiring electrode widths at or near the photolithographic and etching limits.

What is needed are techniques for device realization which are insensitive to manufacturing variations, which do not result in significant compromise of device capabilities or performance, and which are easily implemented in a fashion consistent with current acoustic device design, fabrication and use practices.

SUMMARY OF THE INVENTION

In accordance with the present invention, a novel method and acoustic wave device reflector arrangement is disclosed.

The novel acoustic wave device comprises: (1) an acoustic wave propagating substrate, (2) reflection elements having at least two different widths disposed on the acoustic wave propagating substrate, (3) gaps having one or more breadths disposed between the reflection elements, to enhance reflected acoustic waves so as to as to achieve acoustic reflectivity which is independent of manufacturing variations in the reflection element width.

A method for making an electro-acoustic device which achieves acoustic reflectivity independent of fabrication-related reflection element width variations comprising the steps of: (1) providing an acoustic wave propagating substrate, (2) disposing on the substrate reflection elements having at least two different widths separated by gaps having at least one breadth.

DESCRIPTION OF THE PREFERRED EMBODIMENT

A broad variety of different acoustic eigenmodes have applications in microwave acoustic devices for frequency selection. These include surface acoustic waves (SAWs), or Rayleigh waves; surface skimming bulk acoustic waves (SSBAWs); shallow bulk acoustic waves (SBAWs); surface transverse waves (STWs); Stonely, Sezawa, Love, and other plate and higher order acoustic eigenmodes; longitudinal and shear bulk acoustic waves (BAWs); line acoustic waves (LAWs); and so on. For convenience of explanation, the present invention is described in terms of surface acoustic waves (SAWs), with the understanding that other varieties of acoustic propagation are also applicable, including but not limited to those listed above.

The terms "surface acoustic wave", "coustic wave", and "surface wave" or "SAW", are employed interchangeably herein to stand for any suitable type of acoustic wave propagation. The terms "substrate material", "substrate", "acoustic wave propagating substrate", and "acoustic medium" are employed interchangeably herein to stand for any substrate that supports propagation of acoustic waves. The terms "reflection element" and "reflection electrode" are employed interchangeably herein to stand for reflection elements composed of electrodes.

SAW devices operate at UHF and VHF frequencies, ranging from several tens of MegaHertz to several GigaHertz, where other types of frequency selection components operate with limited effectiveness.

Figure 1:
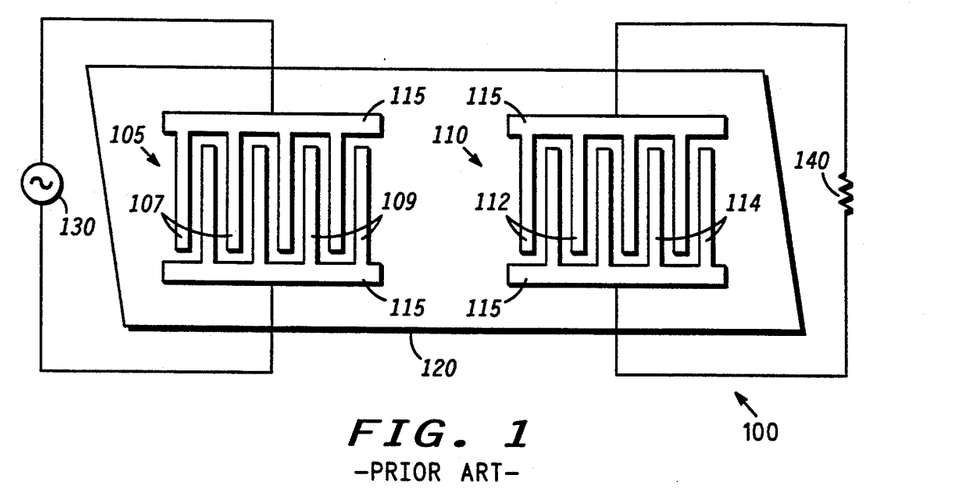
FIG. 1 is a plan view of an acoustic wave filter in accordance with the prior art.

FIG. 1 is a plan view of an acoustic wave filter 100 in accordance with the prior art. Acoustic wave filter 100 comprises substrate 120 and transducers 105, 110 connected to signal source 130 and load 140. Transducers 105, 110 further comprise busses 115 and comb electrodes 107, 109, 112, 114. Transducers 105, 110 convert electrical to acoustic energy, and vice versa. Interdigitated comb electrodes 107, 109, 112, 114 interconnected by busses 115 are made of thin-film metal, deposited, for example, by vacuum evaporation, on the polished surface of substrate material 120 which is in whole or in part piezoelectric. Comb electrodes 107, 109, 112, 114 making up acoustic wave transducers 105, 110 are typically defined photolithographically, using processes well known in the art.

The piezoelectric nature of substrate material 120 causes mechanical waves to be emitted from transducer 105 when excited by electrical signals from signal source 130 having an appropriate frequency, and conversely transducer 110 delivers electrical output signals to load 140 when transducer 110 is appropriately insonified.

Alternatively, thin-film overlays of piezoelectric material, for example, ZnO deposited by dc triode sputtering, can be employed on non-piezoelectric materials such as, for example, single-crystal Si, to allow piezoelectric excitation of acoustic energy on non-piezoelectric substrates. The piezoelectric overlay material can be deposited over the entire surface of the substrate, or may be limited to the transducer 105 alone, for example, by the technique of shadow-masking, as is well known in the art. See, for example, "An integrated ZnO/Si-MOSFET programmable matched filter," by F. S. Hickernell, M. Adamo, A. London, and H. Bush, 1975 IEEE Ultrason. Symp. Proc., pp. 223-226. Surface acoustic waves can be sustained on a broad variety of materials and can be transduced by any means capable of mechanical motion.

In many types of SAW devices, it is extremely desirable to fashion acoustic reflectors for reversing the direction of propagation of acoustic energy at a specified place. This is accomplished by means of periodic structures of reflection elements composed of grooves, or strips of material, or a combination thereof, placed on or penetrating into the acoustic medium surface. When the reflection properties of these individual reflection elements are not constant from one to another due to variations in manufacturing tolerances, device performance and so device yields are adversely affected.

Figure 2A:
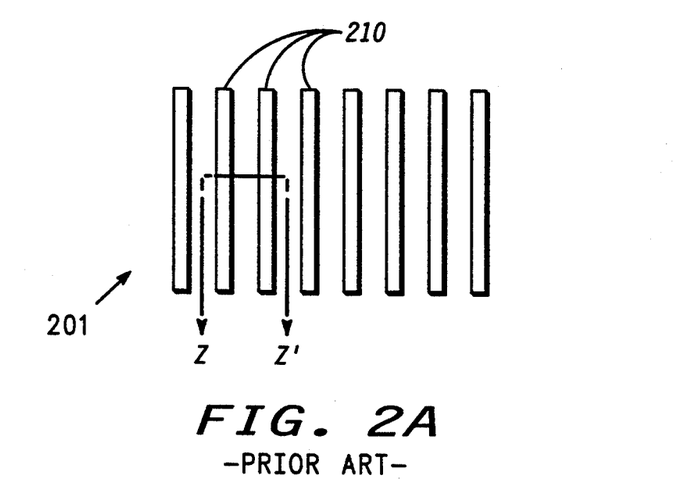
FIG. 2A is a plan view of an acoustic reflector structure in accordance with the prior art.

FIG. 2A is a schematic plan view of acoustic reflector structure 201 comprising reflector elements 210. Reflector elements 210 are oriented such that their long edges are oriented parallel to acoustic equi-phase fronts.

Figure 2B:
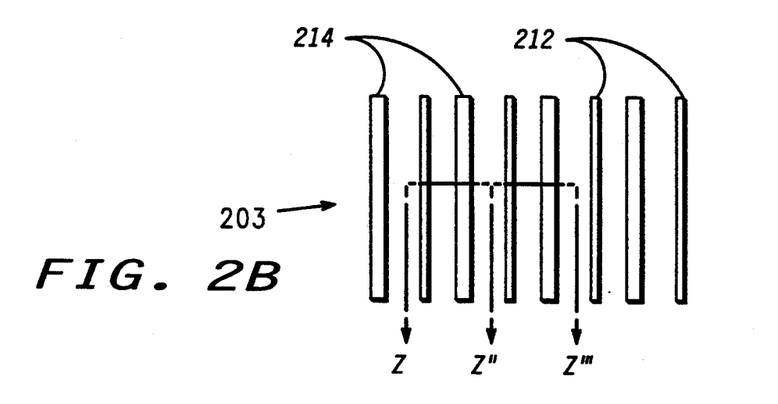
FIG. 2B is a plan view of an acoustic reflector structure in accordance with one embodiment of the present invention.

FIG. 2B is a plan view of acoustic reflector structure 203 in accordance with one embodiment of the present invention, comprising reflector elements 212, 214 having differing widths.

While the acoustic reflector structures 201 of FIG. 2A and 203 of FIG. 2B are illustrated as having reflector elements 210 and 212, 213, respectively, which are electrically independent of one another, this is not an essential feature of the present invention.

Figure 2C:
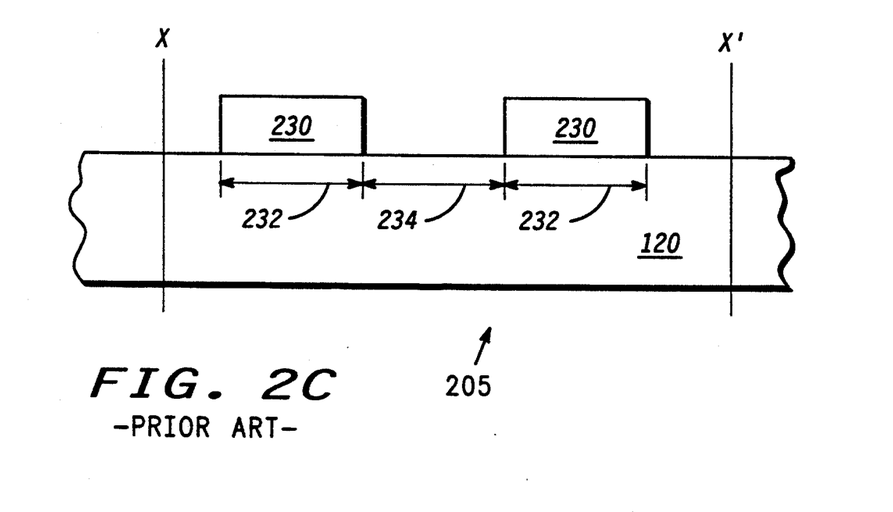
FIG. 2C is cross-sectional view of a portion of a reflection element structure in accordance with the prior art.
Figure 2D:
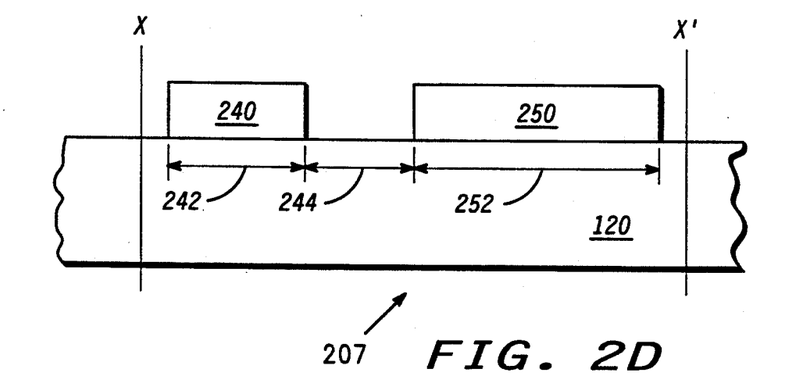
FIG. 2D is cross-sectional view of a portion of a reflection element structure in accordance with the present invention.

FIG. 2C is a cross-sectional view of a portion 205 of prior art reflector structure 201 of FIG. 2A on substrate 120, comprising reflection elements 230 having width 232 and separated by gaps of breadth 234. The cross-section of FIG. 2C is taken along cut Z, Z' of FIG. 2A. FIG. 2D is a similar cross-sectional view of a portion 207 of reflector structure 203 of FIG. 2B on substrate 120 comprising reflector elements 240, 250 having widths 242, 252, respectively, separated by a gap of breadth 244, according to a first embodiment of the present invention. The cross-section of FIG. 2C is taken along cut Z, Z" of FIG. 2B.

Figure 2E:
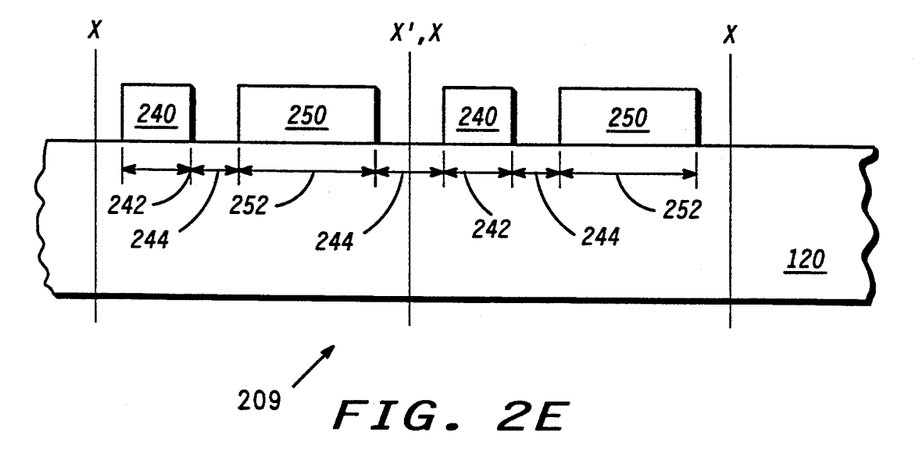
FIG. 2E is a cross-sectional view of concatenated structures according to FIG. 2D.
Figure 2F:
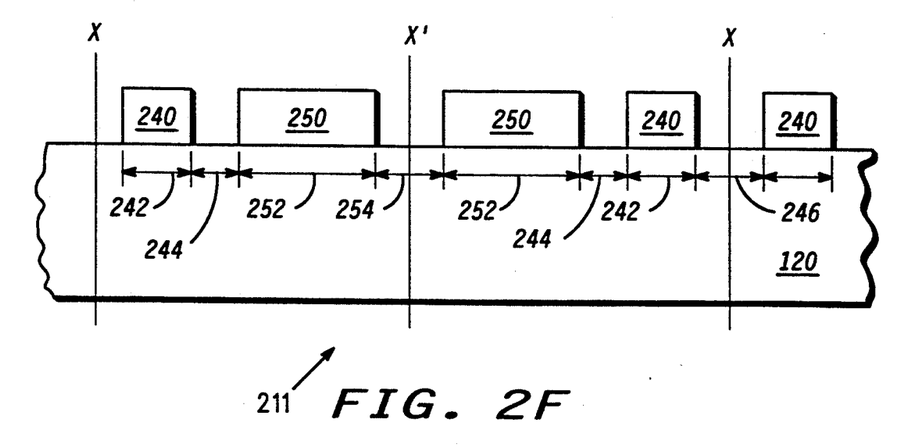
FIG. 2F is a cross-sectional view of concatenated structures, according to FIG. 2D and a mirror image of FIG. 2D.

FIG. 2E is a cross-sectional view of structure 209 comprised of repetitively concatenated structures 207 of FIG. 2D on substrate 120. Structure 209 of FIG. 2E comprises reflection elements 240, 250 of widths 242, 252, respectively, separated by gaps of breadth 244. FIG. 2F is a cross-sectional view of structure 211 comprising repetitive concatenation of structure 207 of FIG. 2D (left side of FIG. 2F) and the mirror image thereof (right side of FIG. 2F) on substrate 120. Structure 211 of FIG. 2F comprises reflection elements 240, 250 of widths 242, 252, respectively, separated by gaps of breadths 244, 246, 254. The cross-sections of FIGS. 2E and 2F are taken along cut Z, Z''' of FIG. 2B.

The vertical scale is greatly compressed in FIGS. 2C-F; acoustic medium 120 is typically tens to hundreds of acoustic wavelengths (on the order of one-half millimeter) thick, while the horizontal distance between X and X' corresponds to one acoustic wavelength (on the order of several to about fifty micrometers). The height of reflection elements 230 of FIG. 2C and 240, 250, of FIGS. 2D-F is typically in the hundreds to thousands of Angstroms. FIGS. 2C-F assume acoustic propagation from right to left, or vice versa, near the top surface of acoustic medium 120.

Reflector structure portion 205 of FIG. 2C consists of metal strips 230 of equal width 232 separated by one or more gaps of breadth 234 nominally equal to width 232 disposed on acoustic medium 120. The structure of FIG. 2C has the disadvantage that any variation of reflection element width 232 alters the acoustic reflection coefficient, with corresponding device performance changes. Thus, the prior art reflection element arrangement of FIGS. 2A, 2C is very susceptible to performance degradation arising from manufacturing variations.

It has been discovered that variations in reflector element performance caused by variations in manufacturing tolerances can be avoided by employing two or more kinds of reflection elements in combination, whose reflection behavior is affected in equal and opposite ways by the same manufacturing variance.

FIGS. 2B, 2D illustrate a reflector structure having this insensitivity to manufacturing variations. Reflector structure 207 of FIG. 2D has the property of exhibiting constant acoustic reflection magnitude despite systematic width variations of reflection elements 240, 250. Reflection elements 240, 250 are conveniently metal strips of differing widths disposed on acoustic medium 120.

Figure 3:
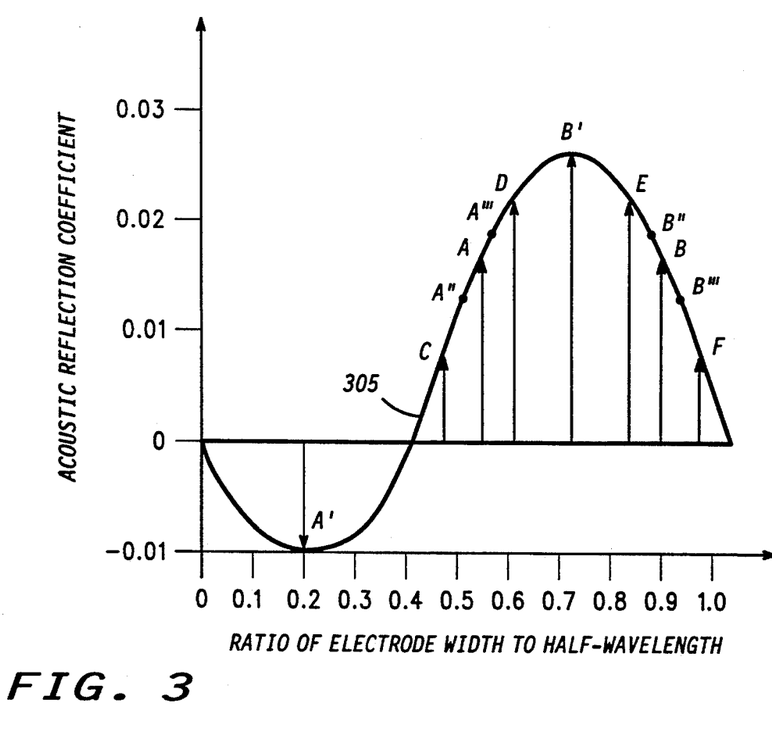
FIG. 3 illustrates the calculated reflectivity of a single reflection element versus electrode width to acoustic wavelength ratio.

FIG. 3 illustrates calculated reflectivity 305 versus the ratio of electrode width to acoustic wavelength. This plot applies to a reflection element composed of a single conductive electrode on the surface of a crystal of 128° Y-cut, X-propagating $LiNbO_3$, when the reflection element is oriented with the long axis normal to the wave propagating direction. FIG. 3 is calculated for an aluminum electrode 3000 Angstroms thick and an acoustic frequency of about 900 megahertz, however, this general curve shape is obtained for a variety of different conditions for this material.

Further discussion of acoustic reflections is found in Wright, "Modelling and experimental measurements of the reflector properties of SAW metallic gratings," Proc. 1984 IEEE Ultrason. Symp., pp. 54-63, and also in Penunuri et al., "Single-phase, unidirectional transducer design for charge transport devices," Proc. 1990 Ultrason. Symp, pp. 237-242.

It is observed that acoustic reflection coefficient magnitudes tend to peak for electrode widths of about one-half of an acoustic wavelength and tend towards zero for electrode widths of about zero and one wavelengths. For the conditions of electrode widths of zero or one wavelengths, discontinuities are no longer present in the acoustic propagation conditions since the film comprising the electrode is either absent or continuous.

It has been found that this behavior may be used to advantage to achieve aggregate acoustic reflection magnitudes which are insensitive to electrode width variations. This is accomplished by employing multiple electrode widths. This approach is broadly applicable to acoustic substrata, since both positive and negative slopes of reflection coefficient versus reflection element width are available, independent of the materials employed for device realization.

Reflectivities per electrode for electrodes 240, 250 of FIG. 2D are shown at locations A and B of FIG. 3. When electrodes 240, 250 have the design target widths 242, 252 indicated by arrows A, B in FIG. 3, they provide equal reflection coefficient magnitudes. In accordance with FIG. 3, width 242 is 0.28 $\lambda$ and width 252 is 0.44 $\lambda$, for example. This provides gap breadths, for example, of 0.14 $\lambda$ for gap breadth 244 of FIGS. 2C-F, and gap breadths of 0.06 $\lambda$ and 0.22 $\lambda$ for breadths 254 and 246 of FIG. 2F. Manufacturing variations may cause their widths to be larger or smaller than their design target widths, so that their individual reflection coefficients are no longer equal. However, by choosing their design widths so that one lies to the left of the peak at B' of curve 305 and the other lies to the right of peak B' of curve 305, the sum of the reflection coefficients of electrodes 240, 250 remains constant even though the individual reflection coefficients vary.

For example, over-etching of electrodes 240, 250 causes the individual electrode widths and corresponding individual reflection coefficients of A to shift to A" and B to shift to B" while the combined reflection coefficients of A+B=A"+B". Conversely, under-etching causes A, B to shift to A''', B''', respectively, but with A+B=A'''+B'''.

Also shown in FIG. 3 are locations C, D, E, F, wherein C, F correspond to similar magnitudes of reflection coefficient, and analogously, D, E. Acoustic reflectors composed of electrodes of widths C, D, E, F, or C, F, or D, E will also exhibit acoustic reflection properties independent of fabricated electrode width.

Similarly, many other combinations of electrode widths provide this important advantage when these widths are chosen in groups, with each group having total reflection coefficients of similar magnitude and opposed acoustic reflection coefficient slope versus electrode width. The numbers of reflection elements comprising each group may differ.

A further variation is also possible in gap breadth without altering the properties of the acoustic reflector. The arrangement of FIG. 2D may be replicated in two basic fashions to form a reflector array. These are to concatenate adjacent sections as depicted in FIG. 2D such that X of one section corresponds to X' of the adjacent section, and to concatenate adjacent sections which are mirror images of one another, with X (or X') of one section corresponding to X (or X') of the adjacent section. These juxtapositions are illustrated in FIGS. 2E and 2F, respectively.

These two configurations differ in that FIG. 2E illustrates two reflection element widths and a single gap breadth, whereas FIG. 2F depicts two reflection element widths and three distinct gap breadths.

Figure 4:
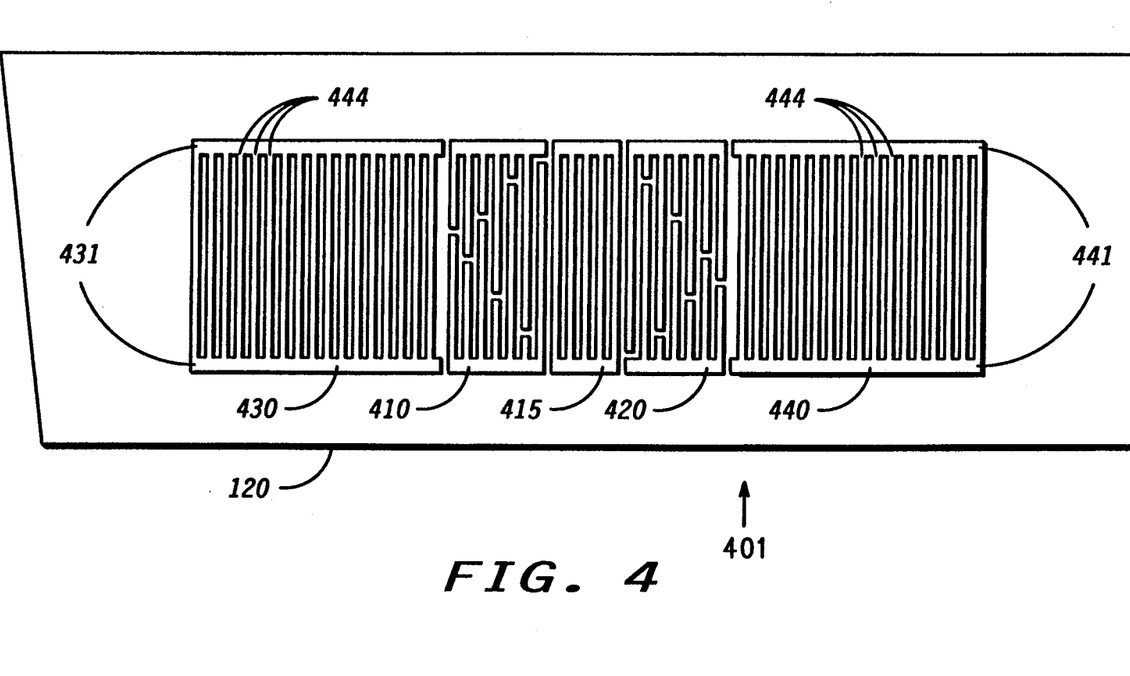
FIG. 4 is a simplified plan view of a resonator comprising a pair of SAW transducers enclosed between a pair of acoustic reflectors, in accordance with the present invention.

One way to determine the reflection coefficient for an acoustic reflector is to measure the bandwidth achieved by a device of the type depicted in FIG. 4. Shown in FIG. 4 are a pair of SAW transducers 410, 420 enclosed between a pair of acoustic reflectors 430, 440, having busses 432, 442, all disposed on substrate 120. Acoustic reflectors 430, 440 form a resonant cavity having properties similar to Fabry-Perot resonators and the like. The transmission response bandwidth from transducer 410 to transducer 420 directly measures acoustic reflector 430, 440 reflectivity, with broader responses occurring for reflectivities approaching unity.

Busses 432, 442 electrically interconnect the individual reflection electrodes 444 comprising acoustic reflectors 430, 440, in contrast to the arrangement of FIGS. 2A and 2B. Either method can be used to realize efficient acoustic reflection in accordance with the present invention.

FIGS. 5-8 provide measured data taken from a group of devices manufactured on a crystal of 128° Y-cut, X-propagating LiNbO₃ substrate, employing A1 electrodes having a thickness of nominally 3100 Angstroms and center frequencies of about 485 MegaHertz, corresponding to an acoustic wavelength of about eight micrometers. The devices which provided the responses depicted in FIGS. 5 and 7 were fabricated on one wafer, while the devices which provided the responses illustrated in FIGS. 6 and 8 were fabricated on a second wafer, all from a single photomask having both distinct device patterns thereon.

Figure 5:
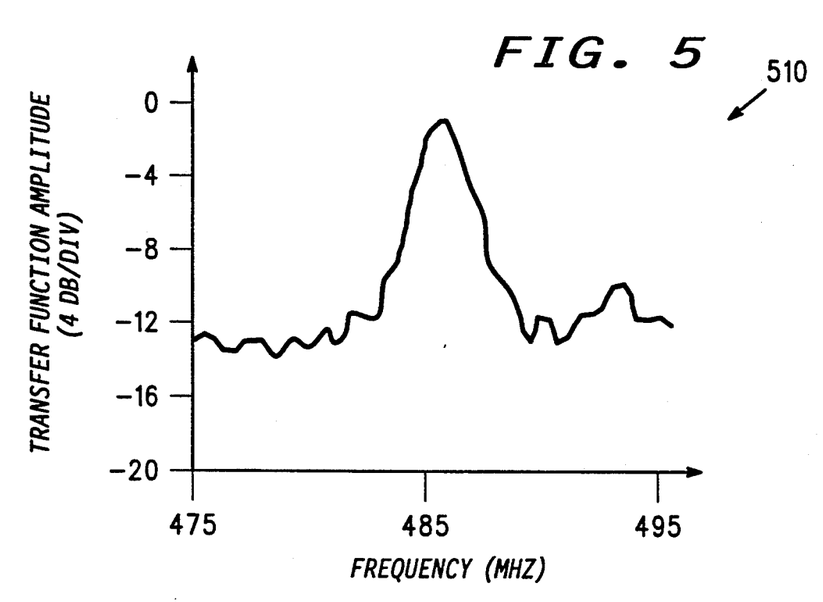
FIG. 5 is a graph of a transmission response of a first resonator device in accordance with the present invention.
Figure 6:
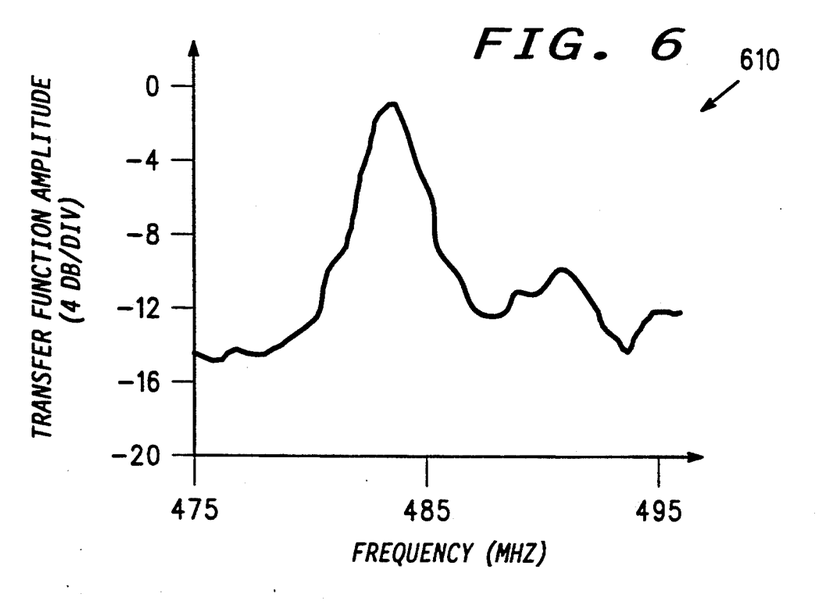
FIG. 6 is a graph of a transmission response of a second resonator device in accordance with the present invention.

FIG. 5 is a graph of transmission response 510 for a device employing reflection elements as depicted in FIGS. 2D, 2E. FIG. 6 is also a graph of transmission response 610 for a device employing reflection elements as depicted in FIGS. 2D, 2E, wherein the reflection elements are broader in width due to under-etching than were those of the device from which data 510 were measured. Data 510 of FIG. 5 and 610 of FIG. 6 are quite similar.

Figure 7:
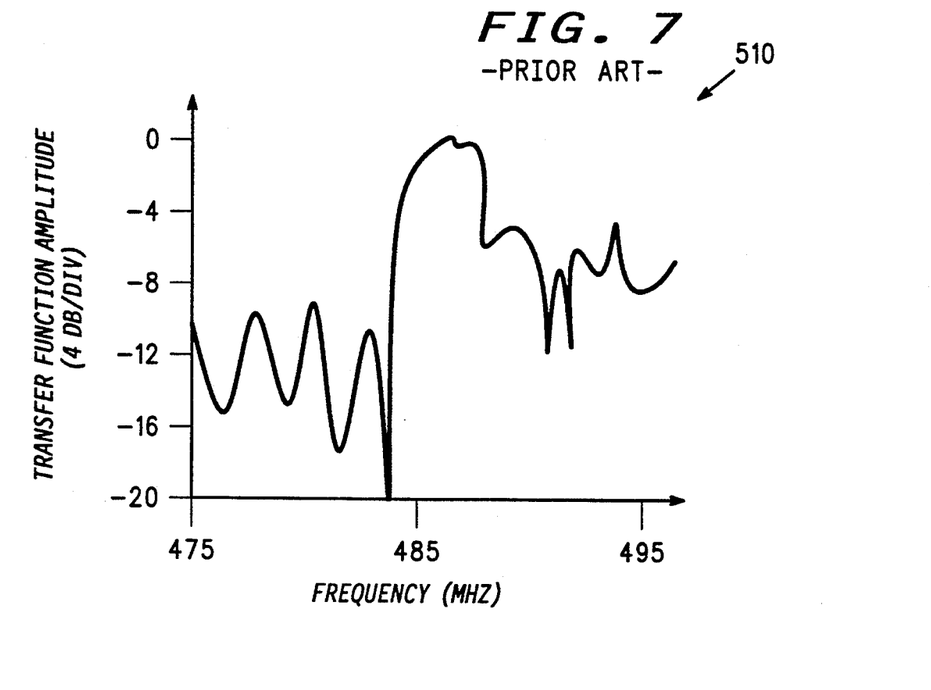
FIG. 7 is a graph of a transmission response for a first prior art resonator device.
Figure 8:
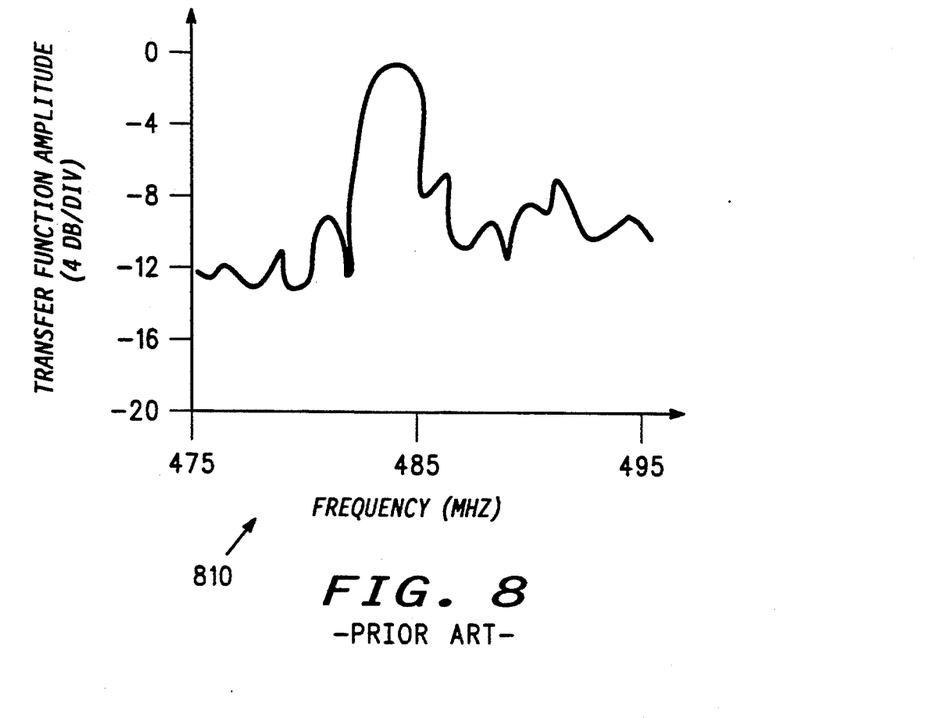
FIG. 8 is a graph of a transmission response for a second prior art resonator device.

FIG. 7 is a graph of transmission responses 710 for a device employing only one reflection element width as depicted in FIG. 2C, while FIG. 8 shows a graph 810 of a response for a similar device, again where electrode widths are larger due to under-etching in the device corresponding to FIG. 8. Comparison of data 510, 610, 710, 810 provided in FIGS. 5-8 shows greater measured device performance changes versus electrode width in data 710, 810 of FIGS. 7 and 8 than are present in data 510, 610 of FIGS. 5 and 6.

This illustrates that the method of choosing electrode widths to maintain a constant total reflector reflectivity provides improved device performance, even in the presence of manufacturing variations which alter reflection properties of individual electrodes comprising the device.

Although the preferred embodiment of the invention has been illustrated, and that form described in detail, it will be readily apparent to those skilled in the art that various modifications may be made therein without departing from the spirit of the invention or from the scope of the appended claims.

What is claimed is;

1. A method for making an acoustic wave device, comprising steps of:

providing an acoustic wave propagating substrate; and disposing a plurality of reflection elements along the acoustic wave propagating substrate in a direction of acoustic wave propagation, the plurality comprising first reflection elements each having at least a first width and a first reflection coefficient, the first reflection elements alternately disposed with at least second reflection elements each having a second width and a second reflection coefficient, the first and second widths being different and selected as a function of reflection coefficient magnitude to produce cancellation of reflection coefficient changes due to similar changes in the first and second widths.

2. A method as claimed in claim 1, wherein the first and second reflection coefficients are approximately equal.

3. A method for forming a reflector arrangement in an acoustic wave device, the method comprising steps of:

providing an acoustic wave propagating substrate;

disposing a plurality of reflection elements on the acoustic wave propagating substrate, the step of disposing the plurality of reflection elements including the steps of:

disposing first reflection elements each having a first reflection element width to acoustic wavelength ratio and a first reflection coefficient on the acoustic wave propagating substrate in a direction of acoustic wave propagation, the first reflection coefficient chosen to occur to a first side of a local extremum of reflection coefficient versus reflection element width to acoustic wavelength ratio; and disposing second reflection elements each having a second reflection element width to acoustic wavelength ratio and a second reflection coefficient on the acoustic wave propagating substrate in a direction of acoustic wave propagation, the second reflection coefficient chosen to occur to a second side of the local extremum, the second reflection element width being different from the first reflection element width, wherein a plurality of gaps having at least a first breadth are disposed between the first and the second reflection elements, and wherein the first and second reflection element widths have reflection coefficient magnitudes which are affected in equal and opposite ways by manufacturing variance in the first and second reflection element widths.

4. A method as claimed in claim 3, wherein said step of providing an acoustic wave propagating substrate comprises the step of providing a piezoelectric substrate.

5. A method as claimed in claim 3, wherein said step of providing an acoustic wave propagating substrate comprises the step of providing one hundred twenty eight degree Y-cut, X-propagating lithium niobate.

6. A method as claimed in claim 3, wherein the steps of disposing first reflection elements and disposing second reflection elements comprise the steps of disposing first and second reflection elements having first and second reflection coefficients of similar magnitudes.

7. A method as claimed in claim 3, wherein said step of disposing second reflection elements includes the step of disposing second reflection elements wherein the plurality of gaps comprise first gaps having a first breadth, second gaps having a different second breadth and third gaps having a still different third breadth.

8. A method as claimed in claim 3, wherein said step of disposing the plurality of reflection elements comprises steps of:
disposing third reflection elements having a third reflection element width, the third reflection element width distinct from the first and second reflection element widths; and
disposing fourth reflection elements having a fourth reflection element width, the fourth reflection element width distinct from the first, second and third reflection element widths.

9. A method for forming a reflector arrangement in an acoustic wave device, said method comprising steps of:
providing an acoustic wave propagating substrate; and
disposing first pairs of first reflection elements and second pairs of second reflection elements on the acoustic wave propagating substrate, the first reflection elements having a first reflection element width to acoustic wavelength ratio and a first acoustic reflection coefficient, the first pairs of first reflection elements interposed with the second pairs of second reflection elements, the second reflection elements having a second reflection element width to acoustic wavelength ratio and a second acoustic reflection coefficient, the first and second acoustic reflection coefficients having similar magnitudes, the similar magnitudes being separated by a local extremum of acoustic reflection coefficient versus reflection element width to acoustic wavelength ratio and wherein first gaps having a first breadth are disposed between the reflection elements comprising the first pair and second gaps having a second breadth are disposed between the reflection elements comprising the second pair of second reflection elements, and third gaps having a third breadth are disposed between the first pairs and the second pairs, wherein the first and second reflection element width to acoustic wavelength ratio and the first, second and third breadth operate together to provide a combined acoustic reflectivity independent of fabricated reflection element widths.

10. A method for forming a reflector arrangement in an acoustic wave device, said method comprising steps of:
providing an acoustic wave propagating substrate; and
disposing first, second, third and fourth reflection elements having first, second, third and fourth reflection element width to acoustic wavelength ratios, respectively, on the acoustic wave propagating substrate, the first, second, third and fourth reflection elements having first, second, third and fourth acoustic reflection coefficients, respectively, wherein the first and second acoustic reflection coefficients have similar magnitudes and the first acoustic reflection coefficient is disposed to a first side of a peak value of acoustic reflection coefficient versus reflection element width to acoustic wavelength ratio and the second acoustic reflection coefficient is disposed to a second side of the peak value, wherein further the third and fourth acoustic reflection coefficients have similar magnitudes, the third acoustic reflection coefficient being disposed to the first side and the fourth acoustic reflection coefficient being disposed to the second side, wherein the first, second, third and fourth reflection element width to acoustic wavelength ratios provide a combined acoustic reflectivity for the reflector arrangement which is independent of fabricated first, second, third and fourth reflection element widths.

11. A method for forming a reflector arrangement in an acoustic wave device, said method comprising steps of:
providing an acoustic wave propagating substrate; and
disposing first, second, third and fourth reflection elements having first, second, third and fourth reflection element width to a coustic wavelength ratios, respectively, on the acoustic wave propagating substrate, wherein the first, second, third and fourth reflection elements are disposed two per acoustic wavelength, the first, second, third and fourth reflection elements having first, second, third and fourth acoustic reflection coefficients, respectively, the first and second acoustic reflection coefficients having similar magnitudes, the first acoustic reflection coefficient disposed to first side of an extremal value of acoustic reflection coefficient versus reflection element width to acoustic wavelength ratio, the second acoustic reflection coefficient disposed to a second side of the extremal value, and wherein the third and fourth acoustic reflection coefficients have similar magnitudes, the third acoustic reflection coefficient disposed to the first side, the fourth acoustic reflection coefficient disposed to the second side, wherein first, second and third gaps having first, second and third breadths, respectively, are disposed such that the first gap is disposed between the first and second reflection elements, the second gap is disposed between the second and third reflection elements, the third gap is disposed between the third and fourth reflection elements, and wherein the first, second and third breadths and the first, second, third and fourth reflection element width to acoustic wavelength ratios provide a combined acoustic reflectivity which is independent of fabricated first, second, third and fourth reflection element widths.

12. A method for forming a reflector arrangement in an acoustic wave device, said method comprising steps of:
providing an acoustic wave propagating substrate;
disposing a first acoustic reflector comprising a first plurality of reflection elements on the acoustic wave propagating substrate, said step of disposing the first plurality of reflection elements comprising steps of:
disposing first reflection elements having a first reflection element width to acoustic wavelength ratio on the acoustic wave propagating substrate; and
disposing second reflection elements having a second reflection element width to acoustic wavelength ratio different than the first reflection element width to acoustic wavelength ratio on the acoustic wave propagating substrate, the first reflection elements having a first acoustic reflection coefficient, the second reflection elements having a second acoustic reflection coefficient, the first and second acoustic reflection coefficients varying in opposite fashions for a similar variation in first and second reflection element width to acoustic wavelength ratios;

disposing a second acoustic reflector comprising a second plurality of reflection elements on the acoustic wave propagating substrate, the step of disposing a second acoustic reflector comprising steps of:

disposing third reflection elements having a third reflection element width to acoustic wavelength ratio on the acoustic wave propagating substrate; and disposing fourth reflection elements having a fourth reflection element width to acoustic wavelength ratio different than the third reflection element width to acoustic wavelength ratio on the acoustic wave propagating substrate, the third reflection element width to acoustic wavelength ratio and the fourth reflection element width to acoustic wavelength ratio providing a combined acoustic reflection coefficient independent of variations in reflection element width to acoustic wavelength ratios of the third and fourth reflection elements; and disposing at least a first acoustic transducer on the acoustic wave propagating substrate between the first and second acoustic reflectors.

13. A method as claimed in claim 12, wherein the first and second reflection coefficients have similar magnitudes.

14. A method as claimed in claim 12, wherein the third and fourth reflection coefficients have similar magnitudes.

15. A method for forming a reflector arrangement in a surface acoustic wave resonator device, said method comprising steps of:

providing an acoustic wave propagating substrate;

disposing a first acoustic reflector comprising first and second reflection elements on the acoustic wave propagating substrate, the first and second reflection elements having first and second reflection element width to acoustic wavelength ratios, respectively, and separated by one or more gap breadths, wherein the first and second reflection elements have first and second acoustic reflection coefficients, respectively, the first and second acoustic reflection coefficients having similar values and varying in opposite fashions for similar variations in the first and second reflection element width to acoustic wavelength ratios;

disposing a second acoustic reflector comprising third and fourth reflection elements on the acoustic wave propagating substrate, the third and fourth reflection elements having third and fourth reflection element width to acoustic wavelength ratios, respectively, and separated by one or more gap breadths; and disposing at least a first acoustic transducer on the acoustic wave propagating substrate between the first and second acoustic reflectors.

16. A method for forming a reflector arrangement in an acoustic wave device, said method comprising steps of:

providing an acoustic wave propagating substrate;

disposing first reflection elements having a first reflection element width to acoustic wavelength ratio and a first reflection coefficient on the acoustic wave propagating substrate, the first reflection coefficient occurring left of a local extremum on a curve depicting acoustic reflection coefficient magnitude on an ordinal axis versus reflection element width to acoustic wavelength ratio on an abscissal axis; and disposing second reflection elements having a second reflection element width to acoustic wavelength ratio and a second reflection coefficient on the acoustic wave propagating substrate, the second reflection coefficient occurring right of the local extremum on the curve, wherein a first number of the first reflection elements and a second number of the second reflection elements provide a combined acoustic reflectivity independent of fabricated reflection element reflection element width to acoustic wavelength ratio for the first and second reflection elements.

17. A method as claimed in claim 16, wherein the first and second reflection coefficients have similar magnitudes.

18. A method as claimed in claim 16, wherein the acoustic wave propagating substrate comprises one hundred twenty eight degree Y-cut, X-propagating lithium niobate.

19. A method as claimed in claim 16, wherein the first and second reflection elements comprise aluminum reflection elements.

20. A method as claimed in claim 16, wherein the first and second reflection elements comprise metal reflection elements.

* * * * *